United States Patent [19]
Decher et al.

[11] Patent Number: 5,208,111
[45] Date of Patent: May 4, 1993

[54] ONE- OR MULTI-LAYERED LAYER ELEMENTS APPLIED TO SUPPORTS AND THEIR PRODUCTION

[75] Inventors: Gero Decher, Wiesbaden-Biebrich; Jong-Dal Hong, Mainz, both of Fed. Rep. of Germany

[73] Assignee: Bayer Aktiengesellschaft, Leverkusen, Fed. Rep. of Germany

[21] Appl. No.: 745,572

[22] Filed: Aug. 15, 1991

[30] Foreign Application Priority Data

Aug. 25, 1990 [DE] Fed. Rep. of Germany ....... 4026978

[51] Int. Cl.$^5$ .......................... B32B 7/04; B32B 31/00
[52] U.S. Cl. .................. 428/420; 156/272.2; 156/278
[58] Field of Search ........................ 428/457, 469, 420; 156/278, 272.2

[56] References Cited

U.S. PATENT DOCUMENTS

| | | | |
|---|---|---|---|
| 4,017,660 | 4/1977 | Barraud et al. | 428/457 X |
| 4,087,582 | 5/1978 | Shirahata et al. | 428/469 X |
| 4,539,061 | 9/1985 | Sagiv | 428/420 X |
| 4,987,023 | 1/1991 | Sato et al. | 428/420 X |
| 5,057,339 | 10/1991 | Ogawa | 428/420 X |

*Primary Examiner*—Thomas J. Herbert, Jr.
*Attorney, Agent, or Firm*—Sprung Horn Kramer & Woods

[57] ABSTRACT

One- or multi-layered layer elements applied to supports are described, which consist of a) a modified support having an even surface, in which modification means the application of ions or ionisable compounds of the same charge over the entire area, and b) one or more layers made of organic materials which in each layer contain ions of the same charge, the ions of the first layer having the opposite charge of the modified support and in the case of several layers each further layer having again the opposite charge of the previous layer.

Layer elements of this type applied to supports are produced by applying the individual layers from solutions of the organic materials in suitable solvents to modified supports by sequential physisorption (salt formation).

8 Claims, 13 Drawing Sheets

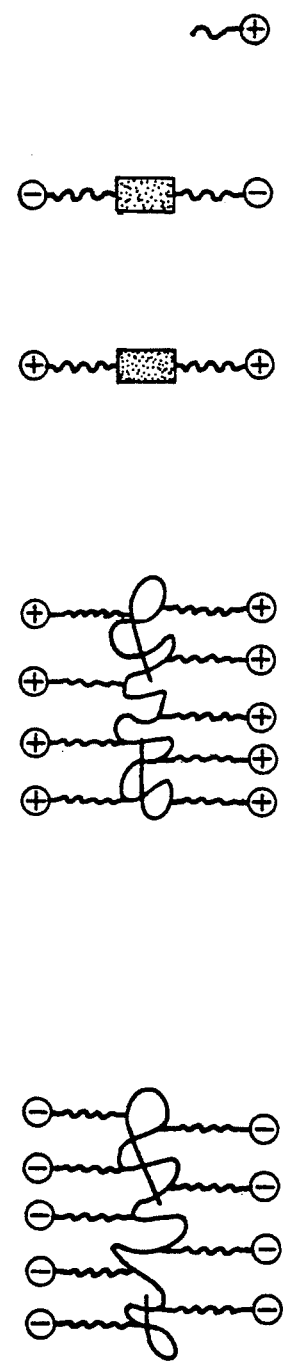
FIG. IA

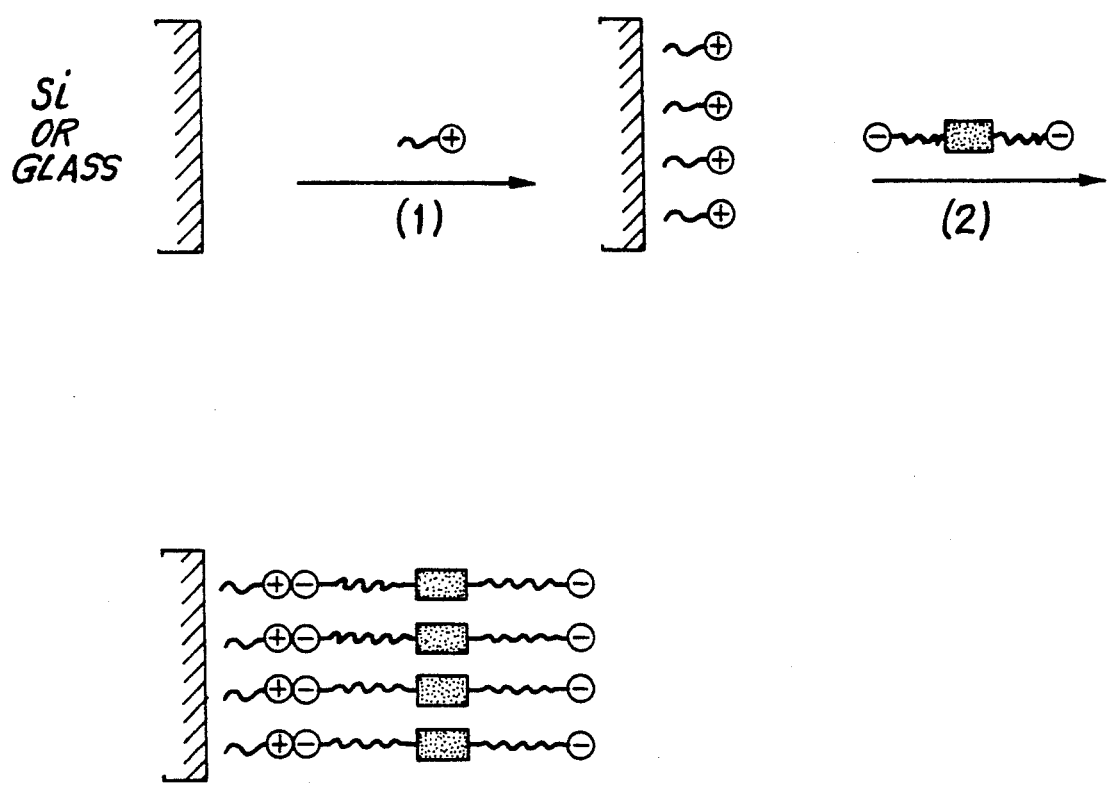
FIG. IB

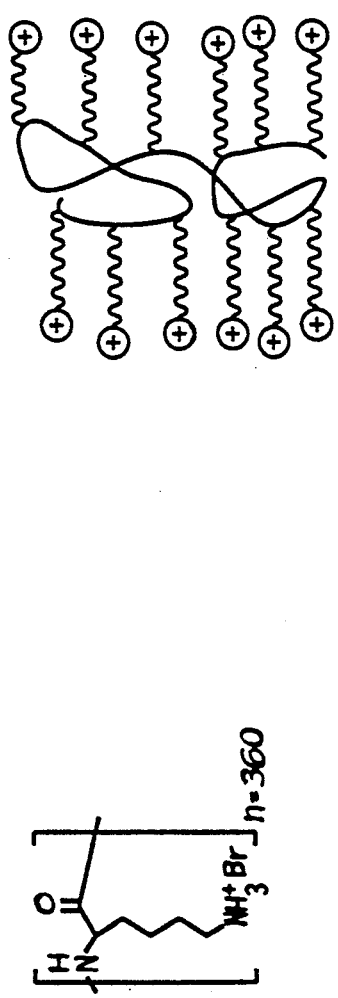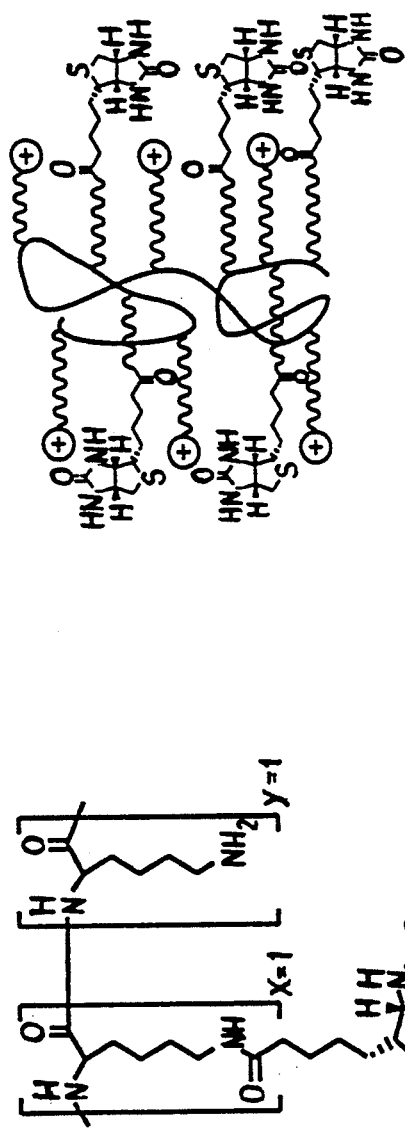
Poly-l-Lysin (MW 75000)
FIG. 9A
Poly-l-Lysin, 50% biotinylated
FIG. 9B

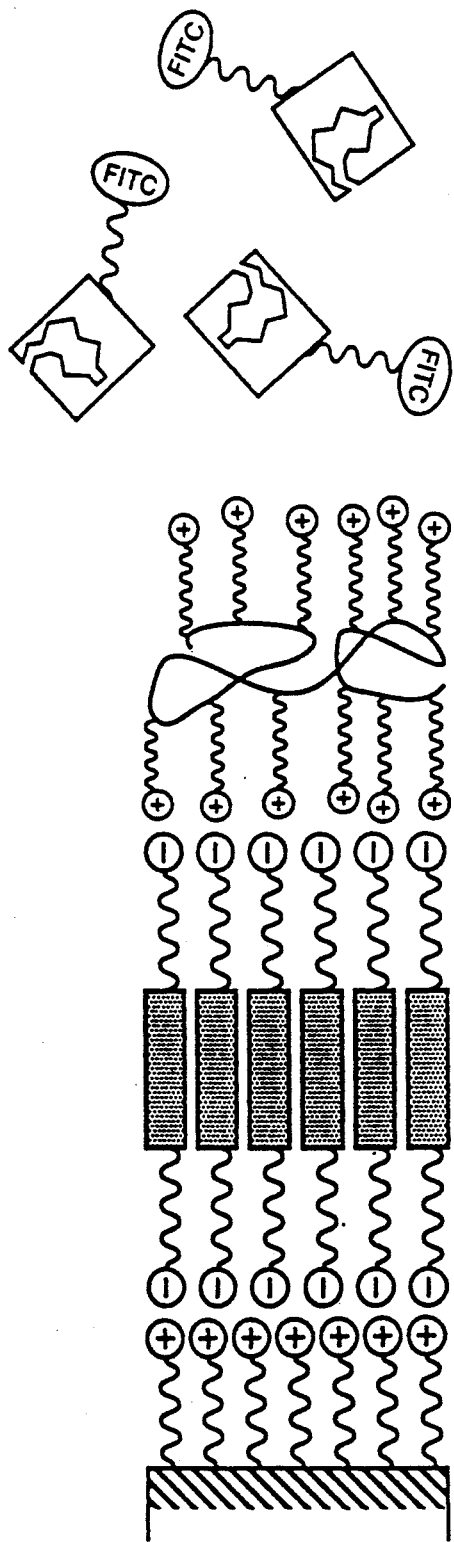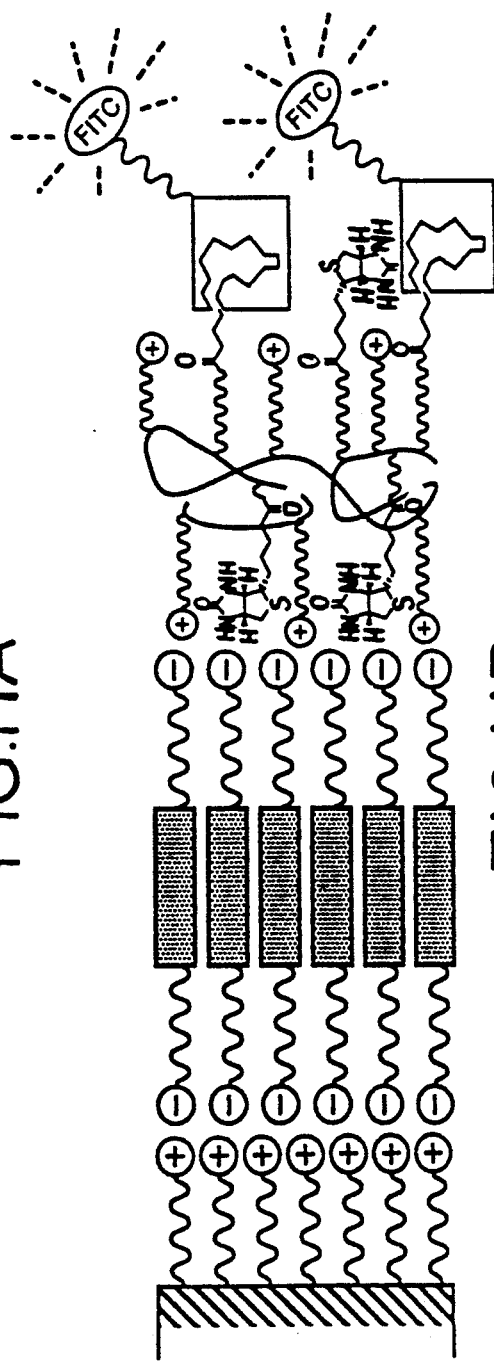
FIG. 11A
FIG. 11B

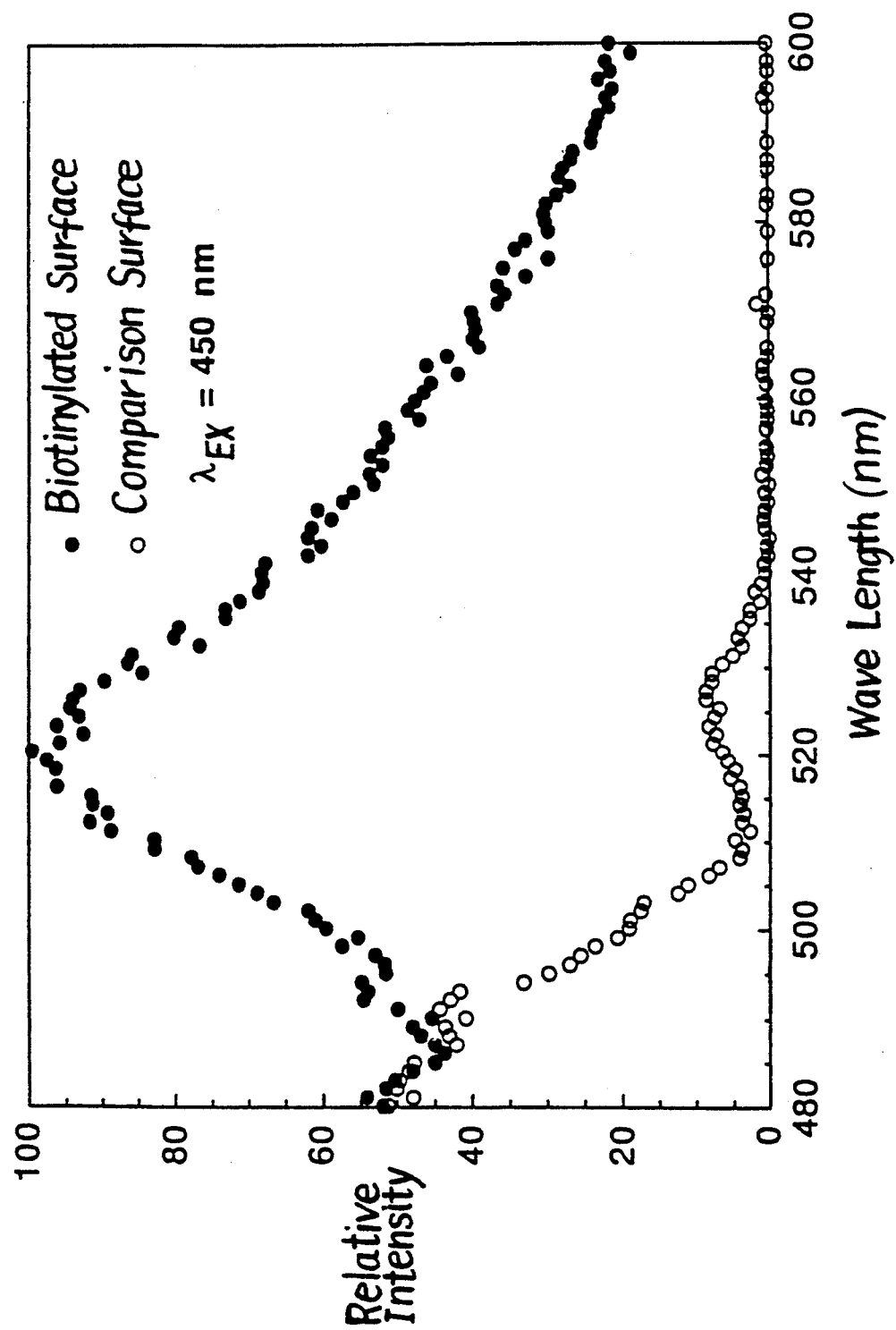

ONE- OR MULTI-LAYERED LAYER ELEMENTS APPLIED TO SUPPORTS AND THEIR PRODUCTION

BACKGROUND OF THE INVENTION

1. Field of the Invention

The invention relates to layer elements applied to supports, which elements can be one- or multi-layered. The individual layers are first applied to a modified support from a solution of organic materials suitable for the layer formation and then applied on top of the previous layer in each case. Thus, construction of these layer elements takes place by sequential physisorption (salt formation). Accordingly, the invention also relates to the production of these layer elements.

Coated supports have a variety of uses in industrial technology. For example, the frictional properties of materials can be adapted to a desired purpose by a suitable treatment of their surface. Furthermore, they can be a protective film for the supports underneath in order to preserve their special surface properties. However, coated supports have recently found application in particular in structural components for optical communication technology and as electronic and optoelectronic information stores.

In particular for electronic and optical purposes, it is necessary to produce extremely thin, defect-free multi-layered coatings whose layers have a high degree of order and an adjustable, substantially homogeneous layer thickness, it being desired of this high degree of order also to be maintained in the range of a large number of coating layers.

Thus, the thin films produced from suitable organic materials are the basis of ordered, defect-free systems on the molecular level, such as are required, for example, for optical applications (guided transmission of low attenuation, for example optical waveguides having nonlinear optical properties), electrical applications (electrical conductors of high anisotropy, for example one-dimensional or two-dimensional conductors in the area of molecular electronics), "host lattices" for defined incorporation or specific binding of functional groups or molecules.

Further areas of application of such layer elements applied to supports are the modification of electrodes and their use in the catalysis of chemical reactions, and sensors, biosensors, surface treatments (for example coating of cationic surfaces, such as interior surfaces of tubings, with heparin to increase biocompatibility).

2. Description of the Related Art

The previously most investigated method for producing ultra-thin films and multi-layered layers is the conventional Langmuir-Blodgett (LB) method. In this method, the layer construction takes place by sequential transfer of monolayers from a water surface to a solid substrate. This method is distinguished by a relatively high apparatus outlay, which nevertheless only allows small supports to be coated. The organic material for building up the layers must be sufficiently spreadable on the water surface.

Furthermore, the attempt has been made to take carboxyl-containing supports, as can be produced, for example, by oxidation of polyethylene supports, as the basis of uniform coating. To this end, for example, long-chain carboxylic acids were applied from a solution to the support described by means of calcium ions. The calcium ions provide an ionic bond between the carboxyl groups of the support and the carboxylic acid applied. Since dicarboxylic acids and calcium ions when applied from a solution would lead immediately to an insoluble and no longer usable salt precipitate, only monocarboxylic acids can be used. If it were decided to apply further layers onto this first layer, first the non-functionalised part of the carboxylic acid molecule which points away from the carboxyl group would have to be functionalised in order to allow the build up to continue. A still further attempt was made to produce a multi-layered layer construction by alternating reaction of 1,10-decanediol bisphosphate with its zirconium salt or by alternating reaction of 1,10-decanediol bisphosphate with zirconyl chloride. These attempts ended after about 8 layers, because by then the surface showed too severe a defect for an ordered further layer build up. In the case where zirconyl chloride was used, the change from the inorganic crystal lattice to the organic crystal combined therewith can be assumed as the source of the defect formation.

Furthermore, it has been observed that where the attempt is made to coat an ionically modified support surface with organic molecules provided on both $\alpha, \omega$ ends with ions, in which the ions have the opposite charge, defects were caused by the fact that many of the organic molecules provided on both sides with ions do not arrange themselves perpendicular to the support surface thus forming a bond with the support only with one ionic end of this molecule, but arrange themselves flat, i.e. parallel to the support surface, and form a bond with the ionic support surface with both ionic ends of the molecule. Thus, on the one hand, no functional group (in this case the second ionic group of this organic molecule) remains for further build up of layers and, on the other hand, such an organic molecule adsorbed in an undesired manner parallel to the support surface covers the ionic groups of the support underneath which are present between the two binding sites formed and prevents these covered ionic groups from forming ordered layers.

Finally, organic monolayers can be formed by adsorption of organic mercapto compounds, for example on gold surfaces (self-assembly technique).

Accordingly, there was still a demand for layer elements applied to supports which have a high degree of order without the defects described. Such layer elements applied to supports should furthermore have a greater mechanical and thermal stability and a greater resistance to solvents than, for example, LB films. In addition, it should be possible to produce new layer elements applied to supports in the form of fairly large areas.

SUMMARY OF THE INVENTION

The disadvantages mentioned are overcome by the one- or multi-layered layer elements according to the invention applied to supports. The layer elements according to the invention form a highly ordered structure which is obtained by physisorption with the formation of salts and in each of which a uniformly charged surface is present which is coated in the subsequent layer with organic molecules having the opposite charge from that of the previous layer.

The invention relates to layer elements applied to a support, comprising a) a modified support having an even surface, in which modification means the application of ions or ionisable compounds of the same charge over the entire area, and b) one or more layers made of organic materials which in each layer contain ions of the same charge, the ions of the first layer having the opposite charge of the modified support and in the case of several layers each further layer having again the opposite charge of the previous layer.

The invention furthermore relates to a process for the preparation of layer elements applied to supports, characterised in that i) a support having a flat surface is modified such that it carries ions or ionisable compounds of the same charge over the entire area, and ii) one or more layers made or organic materials, which in each layer have ions of the same charge, are applied from a solution of such organic materials to the modified support, the organic material for the first layer having ions of the opposite charge relative to the charge of the ions of the modified support and, in the case of multiple layers, alternating further layers containing ions of the opposite charge in each case relative to the previous one are applied in the same manner as the first layer.

BRIEF DESCRIPTION OF THE DRAWINGS

The attached figures (FIG. 1A, 1B and 2–12) illustrate exemplary embodiments in addition to the examples.

DETAILED DESCRIPTION OF THE INVENTION

Figure 2:
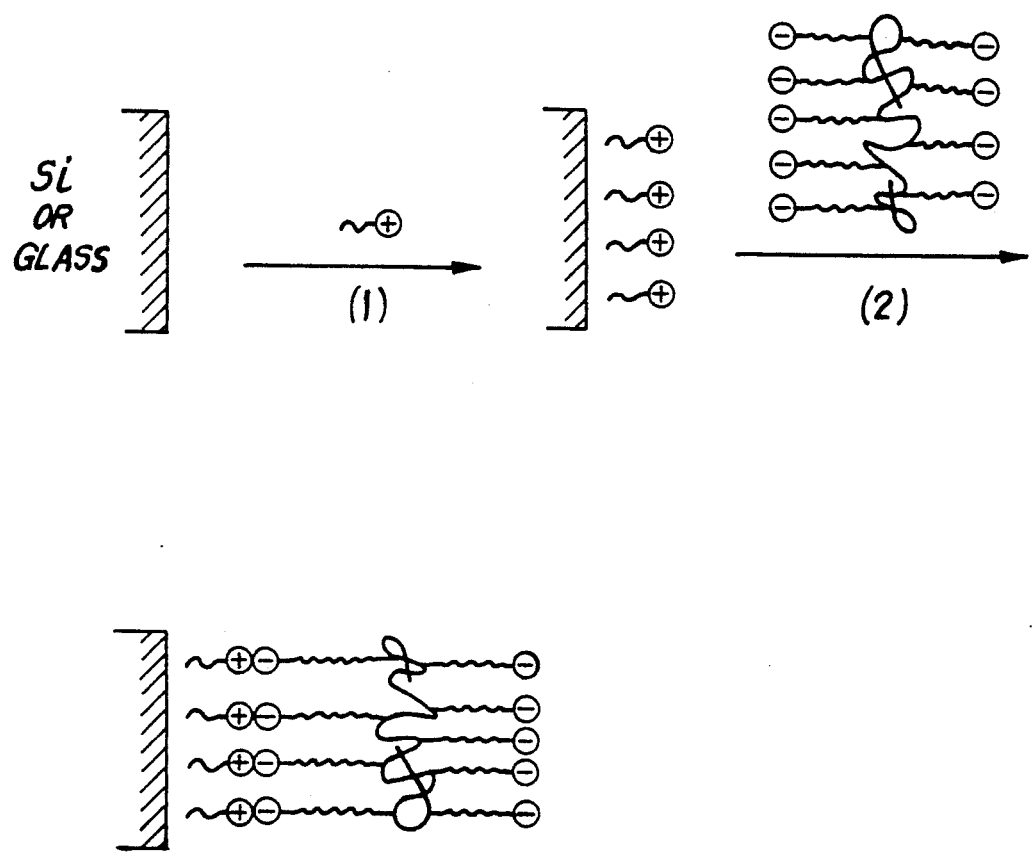

Multi-layer systems of the type described comprise at least two materials having ionic groups of opposite charges. Thus, the simplest layer sequence is of the ABABAB . . . type. However, the functionality of the layers can be selectively increased by using more than 2 materials. for example ABCBABABCB . . . or ABCDCBADCBAC . . . , in which A and C and B and D carry the same charge. The layer sequence is a consequence of the selection of the dipping bath used in each case for applying the individual layers.

The process according to the invention allows large-area highly ordered multi-layered layer elements on supports to be produced.

Suitable supports for the layer elements according to the invention are those having a surface which is flat and accessible to solvents, for example flat, cyliandrical, conical, spherical or other supports of uniform shape, which thus also include interior surfaces of bottles, tubings, and the like; supports having a flat surface are preferred. For various optical or electrical areas of application, the supports can be transparent, impermeable or reflecting as well as electrically conducting, semi-conducting or insulating. The chemical nature of these supports can be inorganic or organic. Examples of inorganic support materials are metals, semi-conductor materials, glasses or ceramic materials, such as gold, platinum, nickel, palladium, aluminium, chromium, steel and other metals, germanium, gallium arsenide, silicon and other semi-conductor materials, glasses of a wide range of chemical composition, quartz glass, further glasses, and porcelain and further mixed oxides, which are understood to mean ceramic materials. Further inorganic substances which are suitable as supports are, for example, graphite, zinc selenide, mica, silicon dioxide, lithium niobate and further supports, if desired in the form of inorganic single crystals, such as are known to one skilled in LB technology.

Organic materials for the supports of the layer elements according to the invention are predominantly polymer materials, due to the dimensional stability and resistance to solvents. Examples which may be mentioned are: polyesters, such as polyethylene terephthalate, polybutylene terephthalate and others, polyvinyl chloride, polyvinylidene fluoride, polytetrafluoroethylene, polycarbonate, polyamide, poly(meth)acrylate, polystyrene, polyethylene or ethylene/vinyl acetate copolymer. Organic supports of this type are also known to one skilled in LB technology.

The chemical nature of the support material plays a minor role, so that the above enumerations are only by way of example and are not exhaustive.

The supports to be used according to the invention have charged or ionisable surfaces or their surfaces are modified such that they are covered over the entire area with ions or ionisable compounds of the same charge. This application over the entire area can be a first monomolecular layer which is solidly attached to the support. However, the application of ions or ionisable compounds over the entire area can also be effected by a chemical reaction on the support itself, in which the surface is densely covered with ions or ionisable groups of the same charge to the extent of forming a monomolecular layer. Such a modification is known to one skilled in the art and working in the area of multi-layered thin films. Examples of these are self-assembly monolayers, for example comprising an $\alpha,\omega$-dithiol, cysteamine, amino-containing thiols and other thiols containing a further ionic or ionisable group, on metals, such as gold, silver, cadmium and others. In this case, the thiol group is solidly bound to the metallic surface and the second thiol group, a carboxyl group, an amino group or another ionic or ionisable group forms the ionic modification of the metallic support to be used. A further important example is silanation of the surface with silanes containing alkoxy groups, which additionally contain a further ionic or ionisable group. This silanation is possible with all silicon-containing supports in a manner known to one skilled in the art. The ionic or ionisable group can be, for example, a sulphur group or an ionisable amino group. A still further example relates to the chemical modification of polymeric organic supports (polymer-analogous reaction). Thus, for example, polyethylene can be provided on the surface with carboxyl groups by means of oxidising agents, such as chromic acid. (Meth)acrylate or (meth)acrylamides can also be provided on the surface with carboxyl groups by means of hydrolysis. Sulphonation of polystyrene resins on the surface also leads to a modification utilisable according to the invention. The last-mentioned modified polymers can also be called flat ion exchangers. Furthermore, it is known to one skilled in the art that instead of anionic groups (carboxyl groups, sulpho groups) cationic groups, such as amino groups, can also be obtained by chloromethylation, followed by the introduction of an amino group. Reactions of this type are known as polymer-analogous reactions.

Furthermore, freshly split mica may be mentioned, on which cationic compounds can be adsorbed directly. Furthermore, on glass or quartz, it is also possible to adsorb cationic compounds, such as polyethyleneimine, after short dipping into sodium hydroxide solution.

In all cases mentioned and in further conceivable ones, it is immaterial which type the ions or ionisable groups on the surface of the support are; instead the dense covering with such groups over the entire area is decisive.

It is also important that it is always ions or ionisable groups of the same charge which constitute the modification of the support.

The organic materials for forming the individual layers on the modified support are either monomeric substances having two ionic or ionisable functional groups of the same charge (so-called bola amphiphiles) or polymers having a multiplicity of ionic or ionisable functional groups of the same charge (so-called polyelectrolytes or polyionenes). These organic materials always carry functional groups of the same charge (i.e. either cations or groups which can be ionised to cations or anions or groups which can be ionised to anions). It is entirely conceivable in this case that different cations or different anions or groups which can be ionised thereto can be represented in the molecule. However, for reasons of accessibility and ease of producibility, it is preferred that the two functional groups in the monomeric substances are identical and that the multiplicity of the functional groups in the polymers is also identical.

The low-molecular-weight bola amphiphiles contain in the centre a hard segment, such as is also present in rod-like (calamitic) liquid crystals as mesogenic group. Examples of such groups are biphenyl, terphenyl, stilbene, tolan, bis(aryl) ester, azobenzenes, or those compounds in which the aromatic ring is hydrogenated. These and other mesogenic groups are known to one skilled in the art. In the general chemical formula (I) given below, the group in question is designated —X— and described in more detail by means of examples.

In the case where monomeric substances are used in the layer elements, preferably those of the formula $$\text{ion}-Z^1-(-Y^1-Z^2-)_m-X-Z^3-Y^2-Z^4-\text{ion} \tag{I}$$

are used in which
X represents

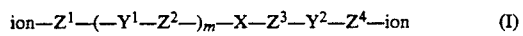

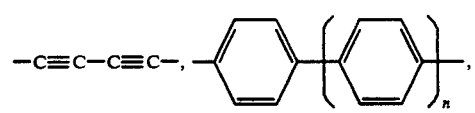

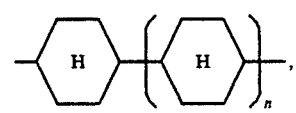

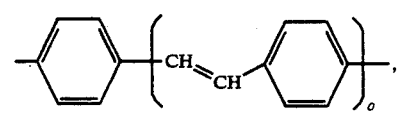

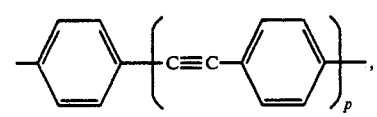

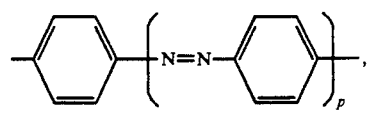

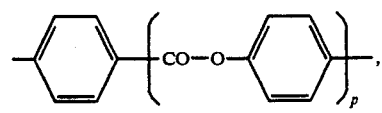

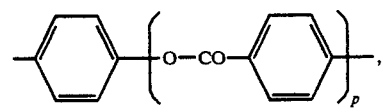

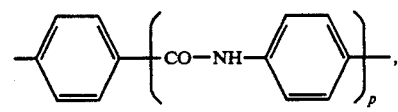

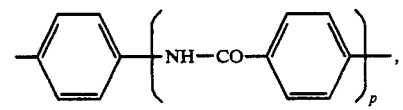

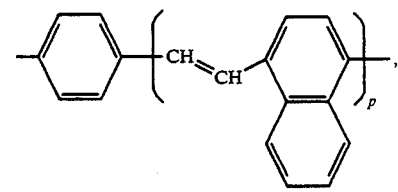

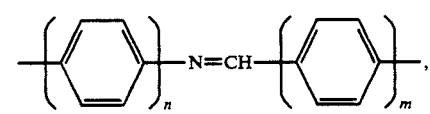

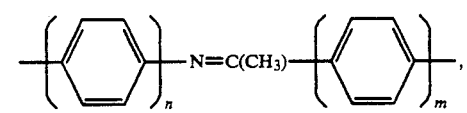

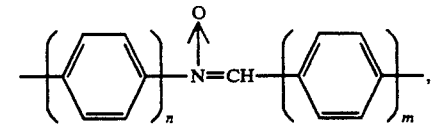

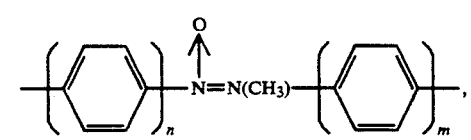

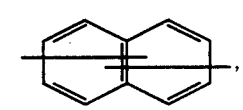

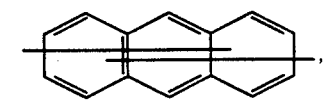

-continued

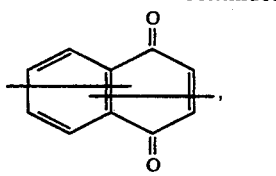

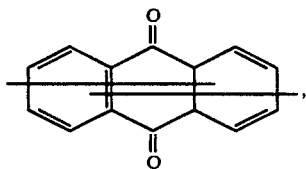

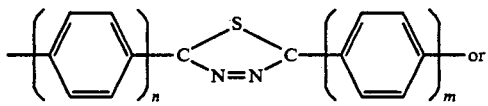

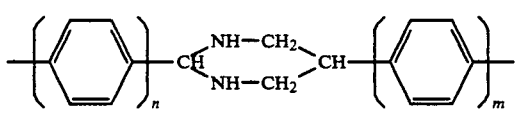

in which the aromatic rings in these groups can be mono- to trisubstituted by methyl, fluorine or chlorine or can be hydrogenated to the cycloalkane, $Y^1$ and $Y^2$, independently of one another, represent —(—CH$_2$—)$_1$—, —(—Si(CH$_3$)$_2$—O—)$_q$—, —(—CH=CH—)$_q$— or —(C≡C—)$_q$—, it being possible for the hydrogen atoms in these groups to be substituted in part or completely by methyl, fluorine or chlorine, $Z^1$, $Z^2$, $Z^3$ and $Z^4$, independently of one another, represent a single bond, —O—, —S—, —CO—, —SO—, —SO$_2$—, —CO—O—, —O—CO—, =N—CO, —CO—N=, —NH— or —N(C$_1$-C$_4$alkyl)—, ion represents a cation or an anion or a group which can be ionised to the cation or the anion, m represents 0 or 1, preferably 1, n represents integral values from 0 to 7, o represents integral values from 1 to 3, p represents the value 1 or 2 and q represents integral values from 1 to 20.

X is preferably one of the groups

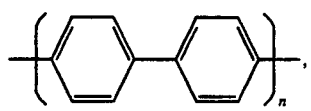

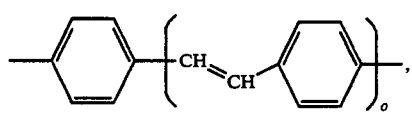

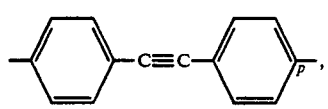

-continued

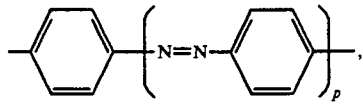

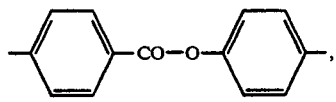

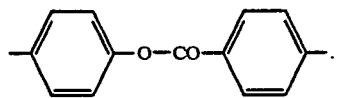

The index n preferably adopts integral values from 0 to 3. The index o preferably adopts the value 1 or 2. The index p preferably adopts the value 1.

$Y^1$ and $Y^2$ preferably represent —(CH$_2$)$_q$—, in which the hydrogen atoms can be replaced in part or completely by methyl, fluorine or chlorine. $Y^1$ and $Y^2$, independently of one another particularly preferably adopt the meaning —(CH$_2$)$_q$—, in which the hydrogen atoms are not substituted. The index q preferably adopts integral values from 4 to 14, particularly preferably from 6 to 12. $Z^1$ to $Z^4$ preferably adopt the meaning —O—, —CH$_2$—, —CO—NH—, single bond or —CO—O—.

Suitable cations bound by $Z^1$ and $Z^4$ are those of the formulae

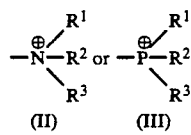

or ionisable, such as

in which $R^1$, $R^2$ and $R^3$, independently of one another, represent hydrogen, straight-chain or branched C$_1$-C$_4$-alkyl or C$_5$-C$_6$-cycloalkyl, in which $R^3$ can furthermore represent phenyl or benzyl and in which furthermore two of the radicals $R^1$ to $R^3$ in (II) or (IV) together with the N atom, which they substitute, can form a pyridine ring, morpholine ring, piperidine ring or pyrimidine ring.

The radicals $R^1$ to $R^3$ preferably represent hydrogen or straight-chain or branched C$_1$-C$_4$-alkyl, it also being possible for $R^3$ to represent benzyl and for two of the radicals $R^1$ to $R^3$ in (II) to form one of the abovementioned heterocyclic rings.

Such cations are combined for charge neutralisation with anions, such as chloride, bromide, iodide, fluoride, tetrafluoroborate, perchlorate, nitrate, sulphate, hydrogen sulphate, tosylate, acetate, methylsulphate, trifluoromethylsulphate, higher alkylsulphonate or benzenesulphonate. Preferred anions for charge neutralisation are the monovalent ones, and of them the simple ones such as halides, perchlorate or acetate.

In the case where ion is an anion, it is, for example, carboxylate, sulphonate, phosphonate or alkylsulphate. For charge neutralisation, these anions are combined with cations of the alkali metals, alkaline earth metals, ammonium ion or ammonium ion which is completely or in part substituted; preferred cations are the monovalent ones, in particular those of the alkali metals and the unsubstituted ammonium ion and tetramethyl ammonium ion.

A functional group which can be ionised to an anion can be, for example, an incompletely dissociated carboxyl group.

A functional group which can be ionised to a cation is, for example, an amino group, which is only protonated by the acidity of the solvent or by an acidic group on the ionic support.

It is in principle possible to use mixtures of various substances of the formula (I), as long as the requirement of a content of ions of the same charge is met. However, in order to obtain layers of uniform thickness, it is preferred to use only one substance of the formula (I) per each layer.

Polymers containing a multiplicity of ionic or ionisable functional groups are also called polyelectrolytes. Examples of anionic or cationic or ionisable groups in such polymers are:

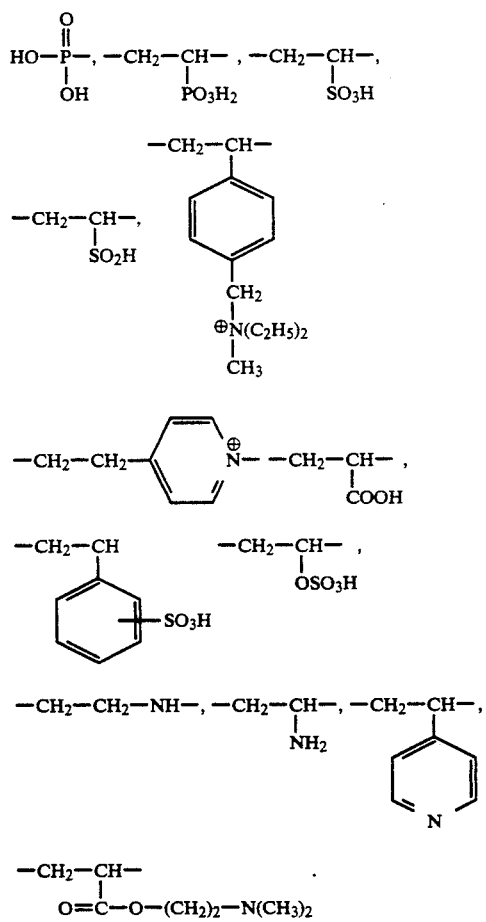

Examples of polyelectrolytes may be as follows: polyacrylic acid, polymethacrylic acid, polyethylenesulphonic acid, polyvinylsulphonic acid, polystyrenesulphonic acid, polyvinylphenylsulphuric acid (phenol ester), maleic acid/alkene copolymer, maleic acid/vinyl alkyl ether copolymer, polyglutamic acid, polylysine, and the corresponding copolymers with neutral amino acids, polyvinylamine, polyethyleneimine, polyvinyl-4-alkylpyridinium salt, poly(methylene)-N,N-dimethylpiperidinium salt, poly(vinylbenzyltrimethylammonium) salt.

Important and readily processable polyelectrolytes are especially:

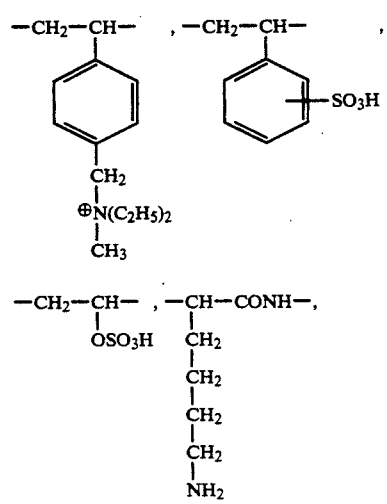

Dextran sulphate, heparin and polyallylamine.

Accordingly, the chain of the polymeric organic material for the layer elements can be a polyolefin, an acrylic polymer, a polyvinyl acetate, a polyester, a polyamide, a poly- or copolyamino acid, such as polylysine or polyglutamic acid, an ionic polysaccharide or another polymer known to one skilled in the art. The polymer can carry the ions or the ionisable functional groups in the monomer unit and thus be water-soluble, but it can initially also be a hydrophobic and thus water-insoluble polymer, in which ions or ionisable groups are incorporated by polymer-analogous reactions.

Dyestuffs and active compounds which are important for the ultimate use of the layer elements according to the invention applied to supports can be applied to monomeric organic materials and also to polymeric organic materials by a covalent bond or integrated therewith. One example is one substance each from the pair antibody/antigen for purposes of sensory analysis, for example from the pair biotin/streptavidin.

In the case where monomeric organic materials are used with the starting mixture having the same molecular length but different molecular structures in the context of the formula (I), lateral crystallisation within a layer constructed therewith can be prevented, which makes this layer two-dimensionally amorphous and thus optically more homogeneous. By varying the composition of such a mixture of monomeric organic materials, it is possible to produce a tailored layer element for various optical requirements. When polymeric organic materials are used (polyelectrolytes), the amorphous character of a layer constructed therewith is in general ensured even without using a mixture of several polyelectrolytes.

While in the case of monomeric bola amphiphiles it is always a complete monolayer of constant thickness which is applied, it is possible in the case of the polyelectrolytes to adjust additionally the thickness of the monolayer applied by varying the parameters of the molecular weight of the polymer, concentration and adsorption time. Thus, low molecular weights and/or small concentrations give small layer thicknesses, while large molecular weights and/or high concentrations give large layer thicknesses.

Furthermore, a special variant of the invention is to apply initially only a layer comprising monomeric organic materials (bola amphiphiles) or a polymeric organic material (polyelectrolyte) to a sensitive modified support, so as to seal the support film sensitised by modification and thus to protect it. At this stage, the further layer formation can initially be halted only, to be resumed after some time (optional temporary storage). Such a one-layer coated modified support thus represents a stable precursor for multi-layered layer elements according to the invention.

To produce the layer elements according to the invention applied to supports, the individual layers can be applied to the modified support from their solutions in a suitable solvent. In each application, a solution containing organic material whose functional groups have in each case the opposite charge is used. Between the individual applications, residual amounts of organic material which are not bonded or only loosely adsorbed are removed from the previous application in each case by rinsing.

Suitable solvents are: water, aqueous solutions of salts (for example NaCl, $MnCl_2$, $(NH_4)_2SO_4$) and water-miscible, non-ionic solvents, such as $C_1$–$C_4$-alkanols, $C_3$–$C_6$-ketones including cyclohexanone, tetrahydrofuran, dioxane, dimethyl sulphoxide, ethylene glycol, propylene glycol and oligomers of ethylene glycol and propylene glycol and ethers thereof and open-chain and cyclic amides, such as dimethylformamide, dimethylacetamide, N-methylpyrrolidone and others. Polar, water-immiscible solvents, such as chloroform or methylene chloride, which can contain a portion of the abovementioned organic solvents, insofar as they are miscible with them, will only be considered in special cases. Water or solvent mixtures, one component of which is water, are preferably used. If permitted by the solubility of the monomeric or polymeric organic materials (bola amphiphiles and polyelectrolytes), only water is used as the solvent, since this simplifies the process.

It has been observed in many cases that monomeric organic materials (bola amphiphiles) arrange themselves in water as the solvent parallel to one another and form micelles, which facilitates an ordered, regular structure on the support. Furthermore, the bola amphiphiles can also be absorbed at an angle other than 90° relative to the support surface or to the last-applied layer, as long as this is carried out in a regular manner throughout the entire layer.

When polyelectrolytes are applied, they bind horizontally and thus prevent a loss of potential binding sites in the layer below. This is additionally favoured by the fact that no discrete covalent bonds are formed, but, as a result of the electrostatic forces, a spatially fixed assignment of the ions on the various layers is not required.

The process according to the invention for producing the new layer elements applied to supports can easily be converted into a continuous procedure by passing the modified support to be coated in succession through various baths containing the organic materials to be applied alternately and through interposed baths containing washing liquids. This reduces the amount of work considerably, compared with the LB method. It is less because the demands on cleanliness between the application of two layers is not as high as in the LB method.

The layer elements according to the invention applied to supports can be constructed by starting in all layers with monomeric organic materials having alternating charges from layer to layer.

Likewise, it is possible to start only with polyelectrolytes having alternating charges from layer to layer. However, it is likewise possible to use alternatingly bola amphiphiles and polyelectrolytes, again with alternating charge in each case.

Polyelectrolytes which carry both cationic and anionic groups and which have a similar absorption behaviour if one of the two groups is present in excess are likewise suitable.

It has been possible to apply up to 110 layers on a modified support as defined according to the invention. The layer elements according to the invention were characterised by the following analytical methods:

The transmission of the layer systems on quartz supports was measured by UV/Vis spectroscopy as a function of the layer thickness. Neither in the case of bola amphiphiles (bands at 284 nm and 263 nm) nor in the case of polyelectrolytes (band at 225 nm) were shifts relative to the solution spectra observed. A uniform layer growth up to a layer number of 38 layers was detected by a constant increase of the optical absorption. Since absorption in even thicker layers exceeds 1.5 and thus moves outside the linear range, the method is inherently inappropriate for thicker layers.

It was shown by ellipsometry at a wavelength of 633 nm that up to a layer thickness of five layers, assuming a constant refractive index, a constant increase in layer thickness occurs with each layer. Using a sample containing 6 layers of bola amphiphiles, a layer thickness of $185 \pm 1.2$ Å at a refractive index of $n = 1.55$ was determined at five different measuring points on a support 2 $cm^2$ in size.

Several samples were investigated by means of small-angle X-ray defraction, but in all cases no Bragg reflection was observed. This indicates poor crystallographic correlation of the individual layers despite the good constant layer thickness of the entire layer (see ellipsometry).

The good homogeneity of the layers was also tested via a light microscope. This showed a dependence of the layer quality on the substrate quality. Effects from the edge of the support on the layer persist to about 2 mm.

Under a light microscope, a lateral structure could not be resolved either by Normarski interference contrast nor by crossed polarisers. Uniform interference colours were observed over the entire coated area with the exception of the edge by direct-light microscopy on reflecting supports (Si-wafers).

The following exemplary embodiments illustrate the process according to the invention, without limiting it thereto. A series of exemplary embodiments are additionally illustrated by the attached figures (FIG. 1A, 1B and 2–12).

FIGS. 1A, 1B and 2–8 show the modification of a support (for example Si or glass) and possible constructions of multilayers by way of examples. The symbols [1] and [2] indicate the process steps to be carried out in succession in each case. FIG. 1A contains five symbols which appear in the following figures (from top to bottom): the cation $C_2H_5O-Si(CH_3)_2-(CH_2)_3-N^\oplus H_3$; the di-anion of compound (5) from Example 5; the di-cation of compound (7) from Example 7; the polymer containing a multiplicity of cations and having the formula

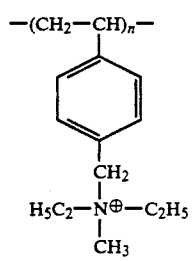
(polymer ammonium cation, for example as polyiodide salt; compound (8) in Example 12);

the polymer having a multiplicity of anions and the formula

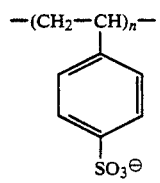
(polystyrenesulphonate, for example as polysodium salt; compound (9) in Example 10).

FIG. 1B shows the modification of a support and possible constructions of multilayers by way of examples (Example 8 and 9).

FIG. 2 illustrates Example 10.

Figure 3:
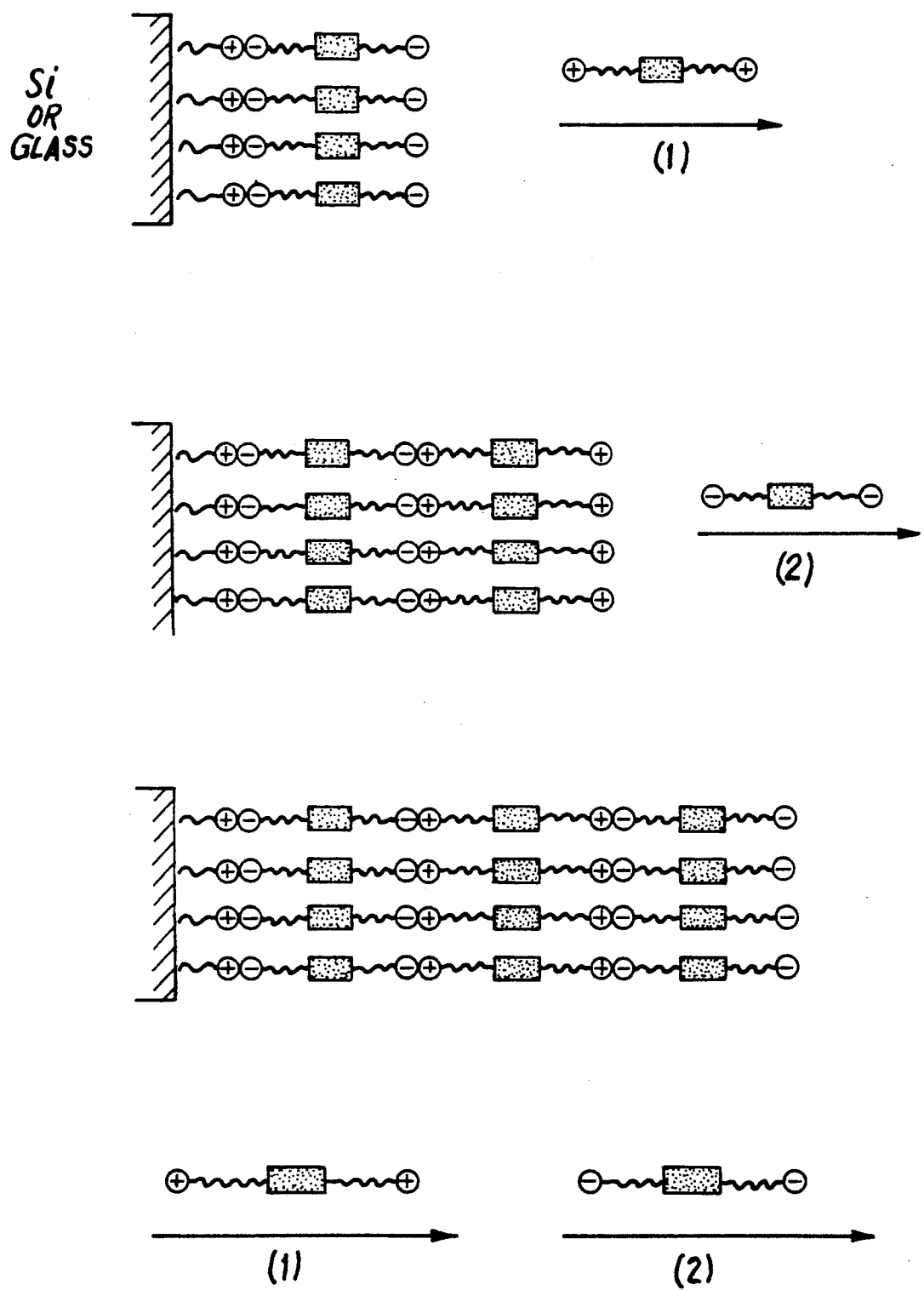
Figure 6:
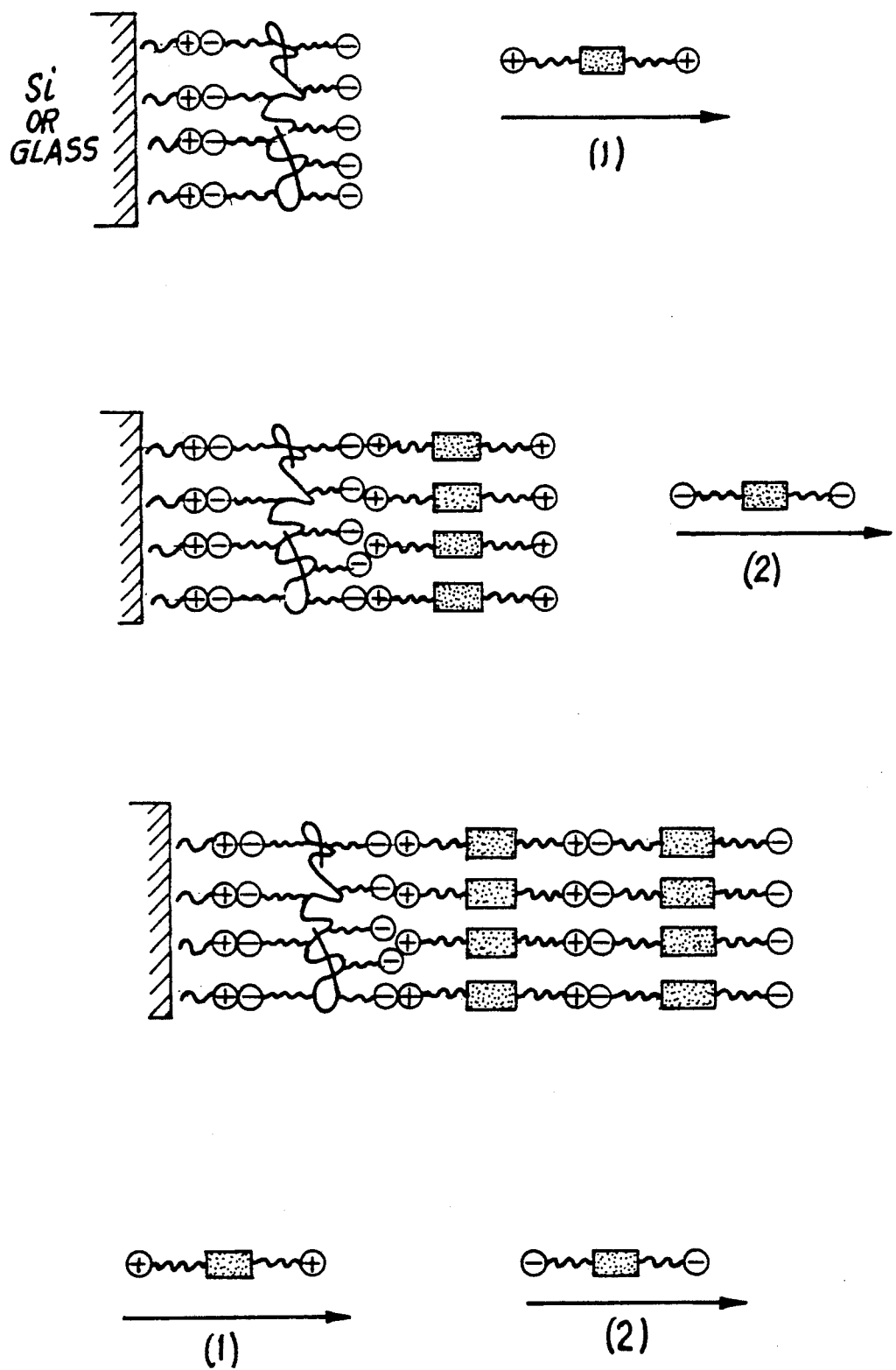

FIGS. 3 and 6 illustrate Example 11.

Figure 4:
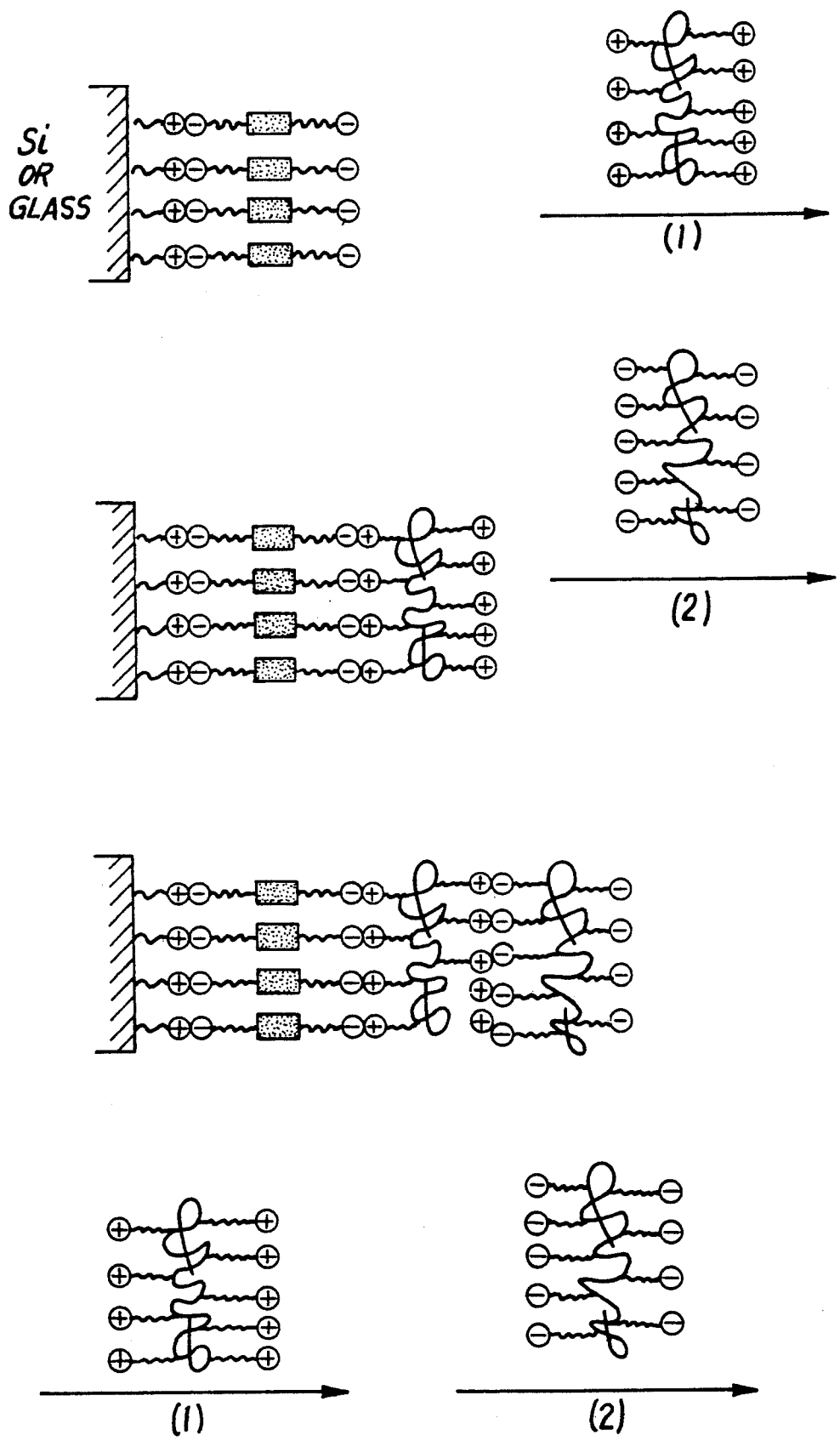
Figure 7:
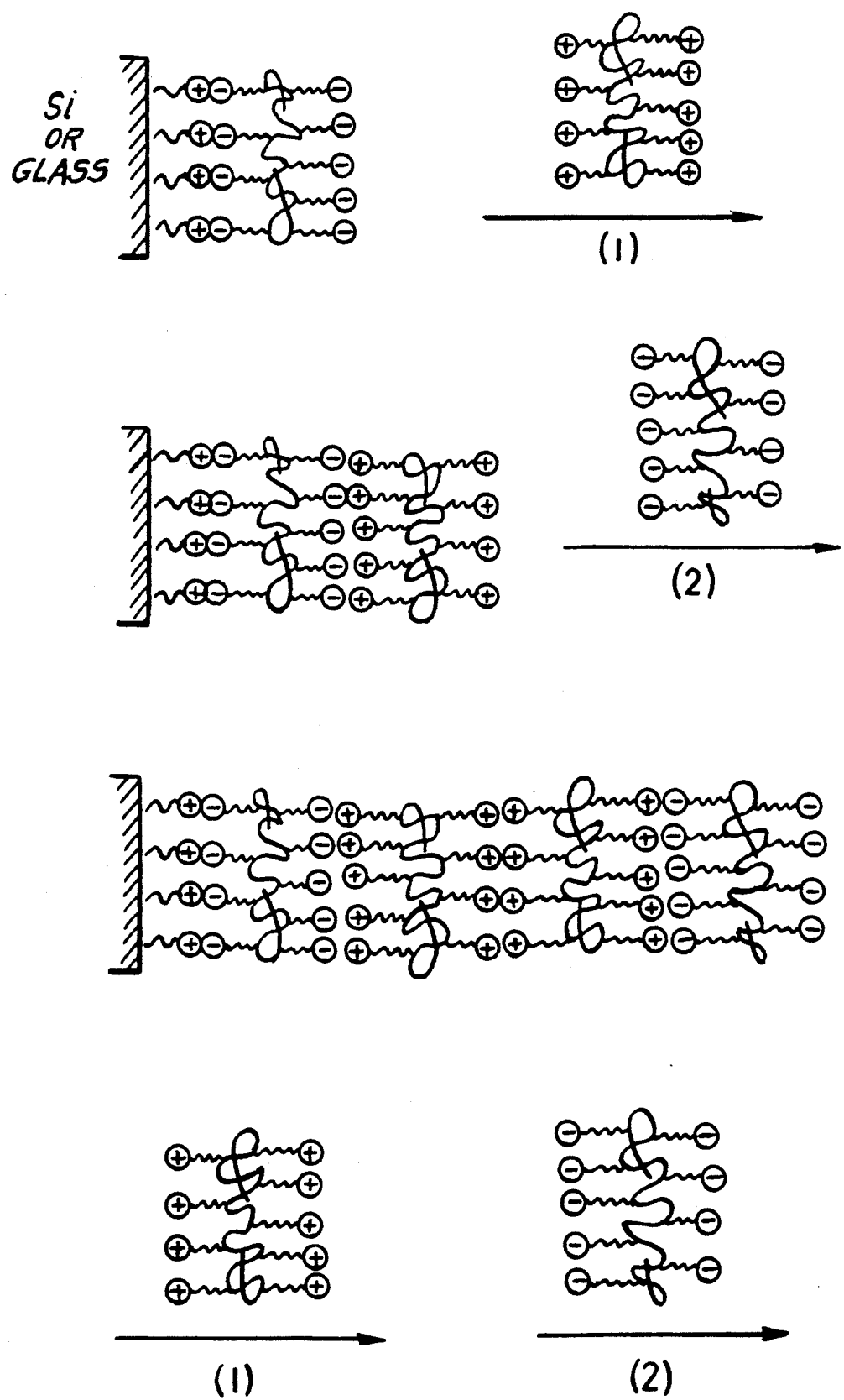

FIGS. 4 and 7 illustrate Example 12.

Figure 5:
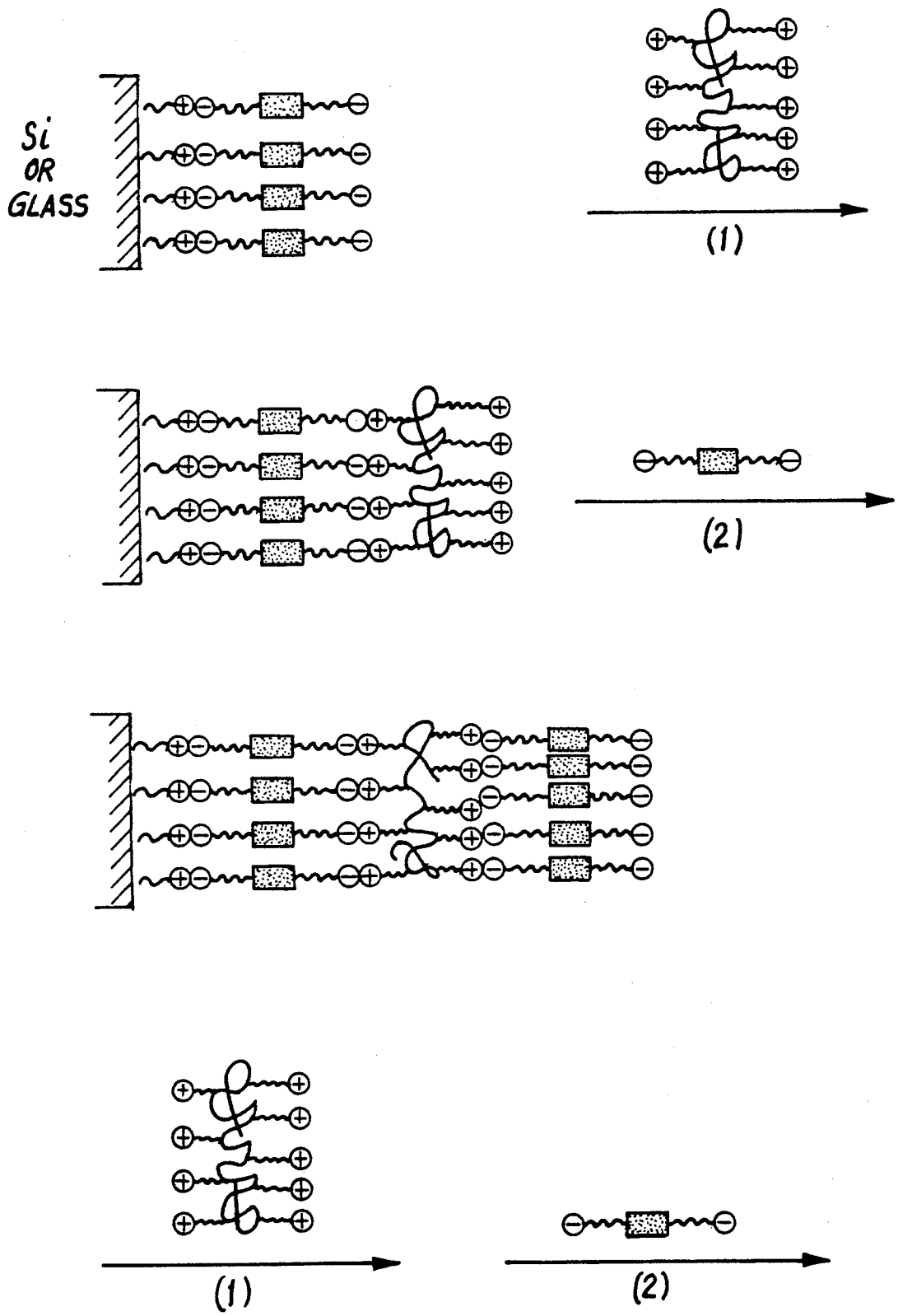
Figure 8:
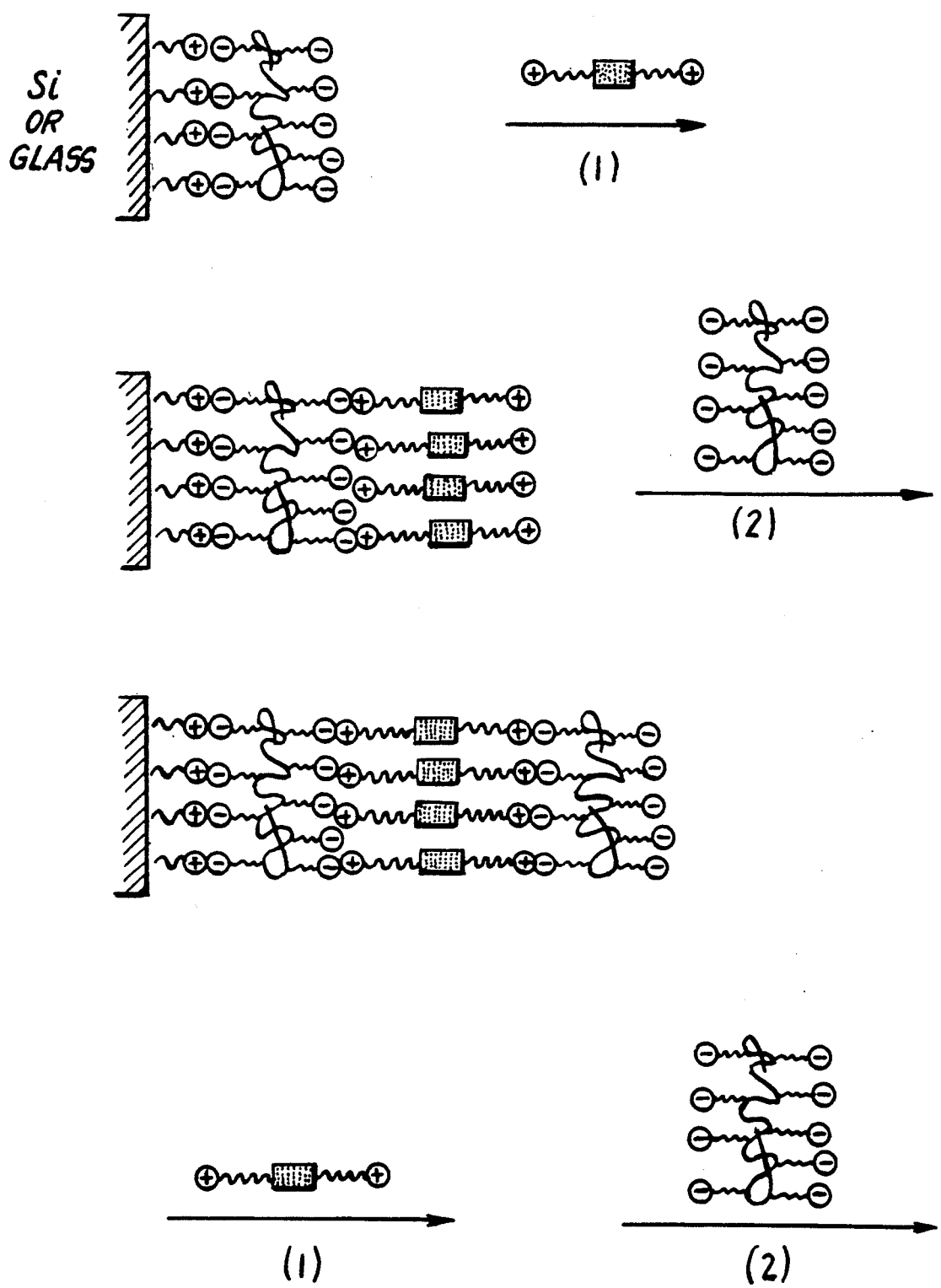

FIGS. 5 and 8 illustrate Example 13.

FIG. 9 shows formulae and symbols for poly-1-lysine of MW 75,000 (top) and biotin-modified poly-1-lysine (bottom); cf. Example 14.

Figure 10A:
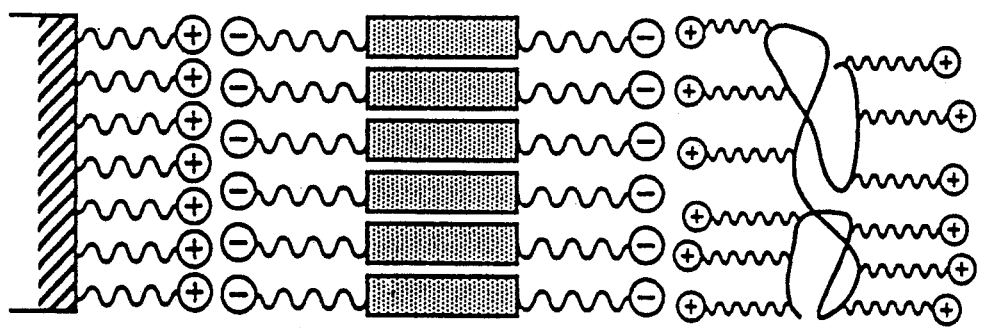
Figure 10B:
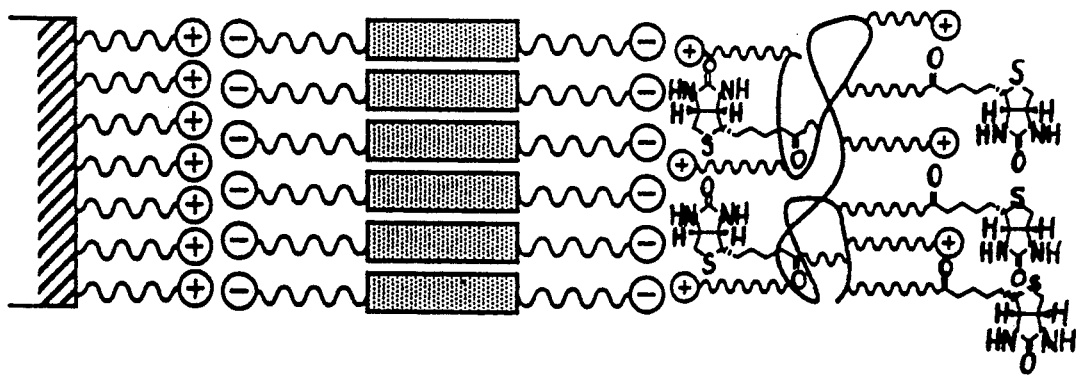

FIG. 10 shows a coated support having a poly-1-lysine topcoat in the upper picture (cf. Example 15); in the lower picture, a topcoat comprising biotin-modified poly-1-lysine has been applied (cf. Example 16).

FIG. 11 represents a bio-specific recognition reaction of a biotin-modified support surface (lower picture) in comparison with a non-biotinylated support surface (upper picture, no recognition) by means of fluorescence-labelled streptavidin (FITC=fluorescein isothiocyanate).

FIG. 12 shows the fluorescence spectrum of the two support surfaces of FIG. 11, upper and lower picture.

EXAMPLES

The reactions of Examples 1 to 7 can be represented by the following equations:

Example 1:

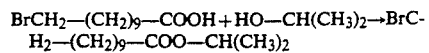

EXAMPLE 2

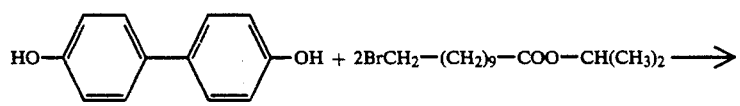

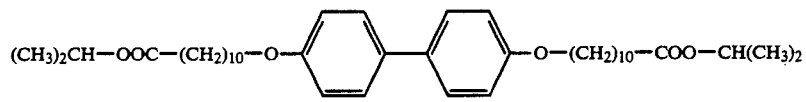

EXAMPLE 3

Hydrolysis of (1)

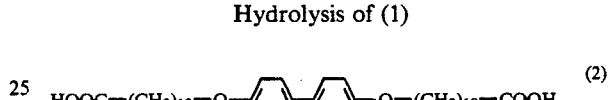

EXAMPLE 4

$(2) + 2\,SOCl_2 \longrightarrow$  (3)

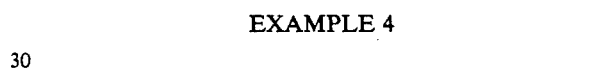

$(3) + 2\,H_2N-(CH_2)_3-N(CH_3)_2 \longrightarrow$  (4)

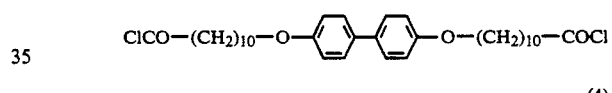

EXAMPLE 5

$(4) + 2\,CH_3J \longrightarrow$  (5)

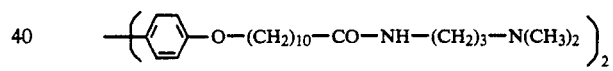

EXAMPLE 6

$2\,BrCH_2-(CH_2)_9-CH_2OH \longrightarrow$

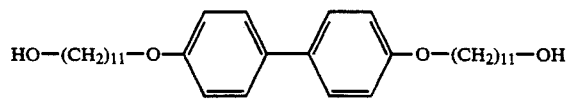

EXAMPLE 7

(6) a) 2 H₂SO₄ + b) 2 KOH ⟶

(7)

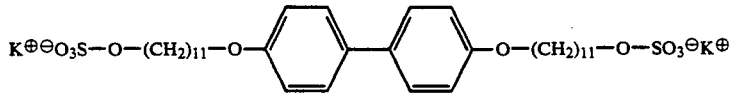

EXAMPLE 1

Preparation of iopropyl 11-bromoundecanoate 40.3 g (0.67 mol) of isopropanol, 3.8 g (0.022 mol) of p-toluenesulphonic acid and 100 ml of $CHCl_3$ were added to 35.6 g (0.13 mol) of 11-bromoundecanoic acid, and the mixture was heated to reflux in a water separator until no more water had separated. After the reaction was complete, the mixture was allowed to cool, washed with water, aqueous sodium bicarbonate solution, and again with water, and the solvent was then distilled off.

Distillation of the yellow oily residue gave 37.8 g (92% of the theoretic yield) of a colourless, clear, somewhat viscous substance.

Identification: IR and NMR spectrum

EXAMPLE 2

Preparation of compound (1) of the above equation 10.4 g (0.06 mol) of 4,4'-dihydroxybiphenyl, 9.4 g (0.18 mol) of KOH and a spatula tip of KI were dissolved in 640 ml of ethanol. The solution was heated to boiling, and then, while boiling was continued, a solution of 42.9 g (0.14 mol) of isopropyl 11-bromoundecanoate in 60 ml of ethanol was then quickly added. This immediately gave a milky cloudy solution, which became still more cloudy with time. After 64 hours, the white precipitate formed was filtered off, washed in portions with 100 ml of hot 10% strength KOH solution and with $H_2O$ until the filtrate gave a neutral reaction. After drying, 25.8 g (73% of the theoretical yield) of a white powder-like substance was obtained.

Identification: IR and NMR spectrum

EXAMPLE 3

Preparation of compound (2)

22.5 g (35 mmol) of compound (1) were suspended in 300 ml of dioxane. The reaction mixture was heated to boiling, and 10 ml of conc. HCl was then added dropwise, leading to the formation of a clear solution. The reaction mixture was then heated under reflux overnight, as a result of which two non-miscible phases were formed. Upon cooling the reaction mixture, a white precipitate formed in the upper organic phase. The precipitate was isolated by filtration and washed with $H_2O$ until free of acid. Recrystallisation from ethanol/dioxane (2/1) gave 18.0 g (92% of the theoretical yield) of a white powder-like substance.

Melting point: 170° to 171° C.
Identification:
1. Elemental analysis:
Found: C 73.76%: H 9.00%: O 17.27%:
Calculated: C 73.61%: H 9.08%: O 19.31%.
2. IR and NMR spectrum.

EXAMPLE 4

Preparation of compound (3) and (4)

4 g (7.2 mmol) of (2) were introduced into a 100 ml three-neck flask equipped with a reflux condenser, dropping funnel and gas inlet valve. 10 ml of thionyl chloride were then added dropwise over a period of 10 minutes with thorough stirring. The reaction mixture was heated under reflux at 110° C. for 2 hours, leading to the formation of a brown clear solution. After the reaction was complete, excess thionyl chloride was removed under a weak water pump vacuum, and the reaction vessel was then aerated with argon. The compound (3) formed was diluted twice with 25 ml each of dried dioxane; the solvent was distilled off in each case at atmospheric pressure.

Thereafter (3) was again dissolved in 25 ml of dry dioxane, and the mixture was brought to about 10° to 15° C. by means of an ice bath, during which (3) remained in solution. After addition of 1.8 g (18 mmol) of triethylamine, 1.6 g (15.5 mmol) of 3-dimethylamino-1-propylamine in 5 ml of dioxane were slowly added dropwise to the reaction mixture with thorough stirring, immediately resulting in a yellow precipitate. The reaction mixture was then stirred at room temperature for 40 hours under an argon atmosphere and then heated to reflux for about 10 minutes. It was allowed to cool to room temperature and then further cooled using an ice bath. The resulting precipitate was isolated by filtration and washed several times with 100 ml of cold acetone. Two recrystallisations from dioxane/acetone gave 2.6 g (50% of the theoretical yield) of the slightly yellowish compound (4).

Identification: IR and NMR spectrum

EXAMPLE 5

Preparation of compound (5)

2.0 g (28 mmol) of (4) were suspended in 100 ml of dimethylformamide (DMF); 1.8 g (12 mmol) of methyl iodide were added to the mixture, which led to the dissolution of (4) in a few minutes. The reaction mixture was stirred overnight with the exclusion of light and under an argon atmosphere. After the reaction was complete, the residue was separated off by filtration. The yellowish product was then isolated by precipitating it twice with $CHCl_3$/ether (1/9), washed in portions with 100 ml of $CHCl_3$/ether (1/9) and then with a small amount of ether. Recrystallisation from ethanol gave 2.5 g (89% of the theoretical yield) of a yellowish substance.

Identification: NMR spectrum.

EXAMPLE 6

Preparation of compound (6)

7.5 g (40 mmol) of 4,4'-dihydroxybiphenyl, 9.9 g (177 mmol) of KOH, a spatula tip of KI and 100 ml of ethanol/$H_2O$ (1/1) were initially introduced into a 500 ml three-neck flask, and the mixture was heated. 24.8 g (99 mmol) of bromoundecanol, dissolved in 200 ml of ethanol/H₂O (3/1), were added dropwise to the boiling reaction mixture over a period of 20 minutes with vigorous stirring. The mixture was then heated under reflux for two days, resulting in a thick brown precipitate. The precipitate was isolated by means of an ultracentrifuge and recrystallised from CHCl₃/ethanol (1/2.5). 12.0 g (57% of the theoretical yield) of colourless silvery flake-like crystals were obtained.

Identification:
1. Elemental analysis:
Found: C 77.42%: H 10.29%: O 12.29%:
Calculated: C 77.52%: H 10.33%: O 12.15%.
2. IR and NMR spectrum.

EXAMPLE 7

Preparation of compound (7)

2.0 g (3.8 mmol) of (6) were suspended in freshly distilled DMF under a nitrogen atmosphere. 7.8 g (37.8 mmol) of dicyclohexylcarbodiimide in 5 ml of DMF were added. 0.8 g (8.4 mmol) of sulphuric acid in 2 ml of DMF were then slowly added dropwise to the reaction mixture; during this time, the temperature was kept below 25° C. by ice cooling. The mixture was stirred at room temperature under a nitrogen atmosphere and with the exclusion of light for 2 days, resulting in a white precipitate. After the reaction was complete, 0.7 ml of H₂O was added to the mixture with ice bath cooling and vigorous stirring. The precipitate was then separated off by filtration. The filtrate containing the product was then brought to a pH of 8.5 with 10% strength KOH solution. The solvent was distilled off, and the residue was chromatographed through 500 ml of silica gel using warm DMF as the eluent. This gave 1.2 g (45% of the theoretical yield) of a white powderlike substance.

Identification: NMR spectrum.

EXAMPLE 8

Silanation of the support

The support used was quartz glass or silicon wafer. The wafer was treated with H₂O in an ultrasound bath for 1 minute and carefully dried with N₂ gas, which cleaned the surfaces and made them dust-free. The wafer was then placed in Caro's acid (conc. H₂SO₄/H₂O₂=7/3) to prepurify and treated therein at 80° C. in an ultrasound bath for 1 hour. After cooling to room temperature, the wafer was treated three times in H₂O in an ultrasound bath for 60 seconds each time and washed free of acid with H₂O. The wafer was then placed into H₂O/H₂O₂/NH₃ (5:1:1) solution and treated therein at 80° C. for 5 minutes. The wafer was then placed in H₂O and carefully washed free of salt. Finally, the wafer was treated before the silanation reaction in methanol, methanol/toluene and toluene for 2 minutes each time to remove traces of water. The wafer thus obtained was placed in 5% strength 3-aminopropyldimethylethoxysilane solution in toluene under an N₂ atmosphere. The silanation reaction was carried out under an N₂ atmosphere for 15 hours. After the reaction was complete, the wafer was first treated twice with toluene under an N₂ atmosphere for 30 minutes each. Finally, the wafer was treated with toluene, toluene/dimethyl sulphoxide (DMSO) and DMSO in an ultrasound bath for 1 minute each time. This gave a homogeneous hydrophobic surface.

EXAMPLE 9

Preparation of a support having a monomolecular interlayer according to FIG. 1B

The quartz glass or Si wafer was treated according to Example 8. This wafer which then contained ionisable amino groups on the surface was treated with a solution of 4 to 5 mg of (5), 0.3 ml of 0.1 N HCl, 1.7 ml of H₂O and 8 ml of DMSO at 0° C. for 20 minutes, during which the negatively charged anions (5) in the solution were adsorbed at the positively charged surface of the wafer with salt formation of the type of ammonium sulphate. The wafer was then first treated in ice-cold H₂O and twice in H₂O at room temperature for 20 seconds each time. This wafer having a monomolecular interlayer was made available to the further preparation of multilayer systems.

EXAMPLE 10

Preparation of a support having a polymer interlayer according to FIG. 2

To this end, the quartz glass or Si wafer was treated according to Example 8. This wafer which then contained ionisable amino groups on the surface was treated with a solution of 20 mg of polystyrene polysulphonic acid sodium salt (9), 0.3 ml of 0.1 N HCl and 9.7 ml of H₂O at room temperature for 20 minutes, during which the negatively charged anions (9) in the solution were adsorbed at the positively charged surface of the wafer with salt formation on the type of ammonium sulphate. This wafer having a polymer interlayer was made available to the further preparation of multilayer systems.

EXAMPLE 11

Preparation of a physisorbed monomolecular multilayer on the monomolecular and polymer interlayer according to FIG. 3 and FIG. 6

The supports prepared according to Example 9 and Example 10, i.e. the support having the monomolecular or polymer interlayer, were used.

The wafer was treated with a solution of 10 mg of (7) in 10 ml of H₂O at room temperature for 20 minutes. This was followed by three rinsing operations in H₂O at room temperature for 20 seconds each time. This wafer was then treated with a solution of 4 to 5 mg of (5), 2 ml of H₂O and 8 ml of DMSO at room temperature for 20 minutes. The wafer was then first treated in ice-cold H₂O and twice in H₂O at room temperature for 20 seconds each time. The multilayer was constructed by repeating these adsorption processes alternately with (5) or with (7).

EXAMPLE 12

Preparation of a physisorbed polymer multilayer on the monomolecular and polymer interlayer according to FIG. 4 and FIG. 7

The support was prepurified and silanised, as described in detail in Example 8. The supports were then treated to give the stable charged surface according to Example 9 and Example 10. The wafer was first placed in a solution of 30 mg of the polymer ammonium salt (8) described above and 10 ml of H₂O and treater therein at room temperature for 20 minutes. The wafer was then washed in 10 ml of H₂O at room temperature three times for 20 seconds each time.

The wafer was then placed in a solution of 30 mg of the polystyrene sulphonate (9) described and 10 ml of $H_2O$ and treated therein at room temperature for 20 minutes. The wafer was then treated three times in 10 ml of $H_2O$ at room temperature again for 20 seconds each time. The polymer multilayer was constructed by continuing this process in the manner described in Example 11.

EXAMPLE 13

Preparation of an alternating multilayer comprising a monomolecular di-anion and the polymer ammonium salt described in the above scheme on the monomolecular and polymer interlayer according to FIG. 5 and FIG. 8

The support was prepurified and silanised, such as was described in detail in Example 8. The supports were then treated to give the stable charged surface according to Example 9 and Example 10.

The wafer was first placed in a solution of 30 mg of the polymer ammonium salt (8) described in the above reaction scheme and 10 ml of $H_2O$ and treated therein at room temperature for 20 minutes. The wafer was then washed in 10 ml of $H_2O$ at room temperature three times for 20 seconds each time. The wafer was then placed in a solution of 4 to 5 mg of (5), 2 ml of $H_2O$ and 8 ml of DMSO and treated therein at room temperature for 20 minutes. The wafer was then first treated in ice-cold $H_2O$ and twice in $H_2O$ at room temperature for 20 seconds each time.

The alternating multilayer was constructed by continuing this process in the manner described in Example 11 and Example 12.

EXAMPLE 14

Preparation of $\epsilon$-biotinylated poly-1-lysine (compound 8)

Compound 8 was prepared by reaction of poly-1-lysine (SERVA, Mn=50,000–100,000) with the activated biotin active ester (biotin N-hydroxysuccinimide=BNHS). 50 mg (0.5 mmol) of poly-1-lysine and 30 mg (0.5 mmol) of triethylamine were initially introduced into a 100 ml flask and dissolved in 30 ml of methanol. 40 mg (0.024 mmol) of BNHS, dissolved in 10 ml of $CHCl_3$/isopropanol (1:1), were then slowly added dropwise to the reaction mixture, which was then heated to reflux for one hour with stirring and then stirred at room temperature overnight. The resulting yellowish precipitate was isolated by filtration. It was suspended in 30 ml of methanol, stirred under reflux for 20 minutes, and again cooled to room temperature. The solid was again separated off by filtration and washed in portions three times with 20 ml of methanol each time, again suspended in 10 ml of $CHCl_3$/isopropanol (1:1), again stirred under reflux for 20 minutes and again cooled to room temperature. After filtering, the solid was washed in portions three times with 20 ml of $CHCl_3$/isopropanol (1:1) each time. The residue thus isolated was dried under an oil pump vacuum, dissolved in a small amount of distilled water and freed from low-molecular-weight by-products by gel permeation chromatography. The pure colourless copolymer was obtained from an aqueous solution by freeze drying. The yield was 25% of theory. The biotinylated poly-1-lysine was characterised by IR and NMR spectroscopy. According to $^1H$ NMR, the composition of the copolymer (1-lysine/$N_\epsilon$-biotinyllysine) is 1:1 (formulae shown in FIG. 9).

EXAMPLE 15

Preparation of a physisorbed multilayer having a poly-1-lysine topcoat

The support was prepurified and silanised, as described in detail in Example 8. The support was then provided according to Example 9 with a negative surface by adsorption of the low-molecular-weight dianion.

The wafer was treated at room temperature with a solution of 2 mg of poly-1-lysine in a mixture of 2.8 ml of $H_2O$ and 0.2 ml of 0.1 N HCl for 20 minutes. The wafer was then washed three times in 10 ml of $H_2O$ at room temperature for one minute each time (diagram in FIG. 10, upper picture).

EXAMPLE 16

Preparation of a physisorbed multilayer having a topcoat comprising biotinylated poly-1-lysine (compound 8)

The support was prepurified and silanised, as described in detail in Example 8. The support was then provided according to Example 9 with a negative surface by adsorption of the low-molecular-weight dianion.

The wafer was treated at room temperature with a solution of 2.3 mg of the biotinylated poly-1-lysine prepared in Example 14 in a mixture of 2.8 ml of $H_2O$ and 0.2 ml of 0.1 N HCl for 20 minutes. The wafer was then washed three times in 10 ml of $H_2O$ at room temperature for one minute each time (diagram in FIG. 10, lower picture).

EXAMPLE 17

Biospecific recognition reaction of a biotinylated support surface in comparison with a non-biotinylated support surface by means of fluorescence-labelled streptavidin The multilayer systems prepared in Example 15 and Example 16 were dipped simultaneously into a solution of 0.02 mg of streptavidin labelled with fluorescein isothiocyanate in 4.0 ml of 0.15 M NaCl solution at room temperature. After 20 minutes, both supports were washed three times in 10 ml of $H_2O$ at room temperature for one minute each time and then analysed by fluorescence microscopy and spectroscopy. The support prepared in Example 15 having a surface comprising pure poly-1-lysine showed very little fluorescence under the fluorescence microscope, which was due to a few adsorbed fluorescent particles. The support prepared in Example 16 having a surface comprising biotinylated poly-1-lysine showed an evenly distributed very intensive fluorescence under the fluorescence microscope (diagram in FIG. 11). The relative fluorescence intensity at the fluorescence maximum found for the support from Example 16 by fluorescence spectroscopy was 100 scale divisions. The support from Example 15 showed a relative fluorescence intensity of 8 scale divisions.

The fluorescence spectrum for Example 17 is shown in FIG. 12.

What is claimed is:

1. A layer element applied to a support, comprising:

(a) a modified support having an even surface, in which modification means the application of ions or ionizable compounds of the same charge over the entire surface area of the support, and
(b) one or more layers made of organic materials which in each layer contain ions of the same charge, the ions of the first layer having the opposite charge of the modified support and, in the case of further layers, each further layer having a charge opposite that of the previous layer, wherein the organic material is a monomeric substance having two ionic or ionizable functional groups of the same charge, the monomeric substance having the formula $$\text{ion}-Z^1-(-Y^1-Z^2-)_m-X-Z^3-Y^2-Z^4-\text{ion} \qquad (I)$$

in which
x represents

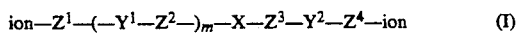

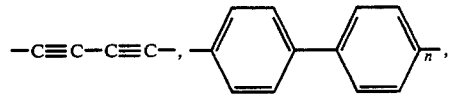

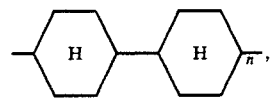

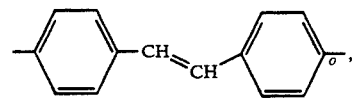

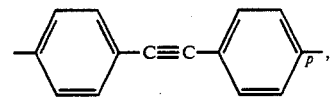

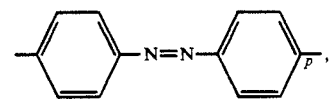

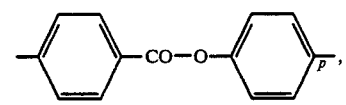

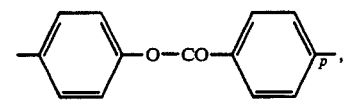

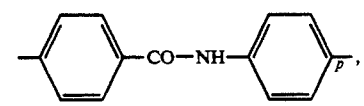

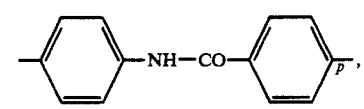

-continued

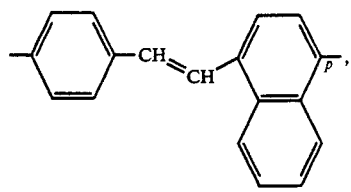

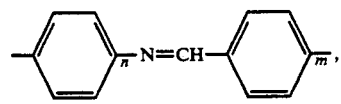

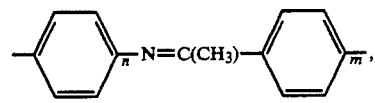

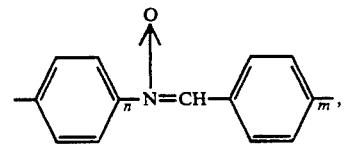

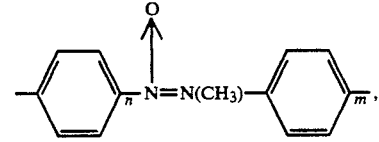

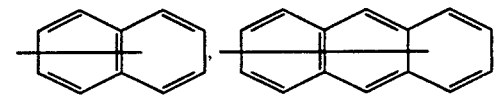

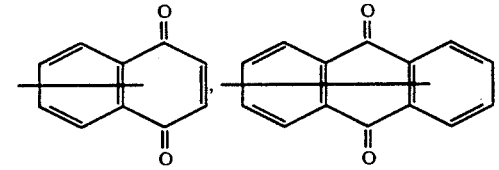

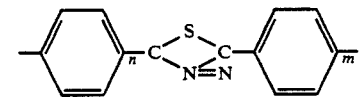

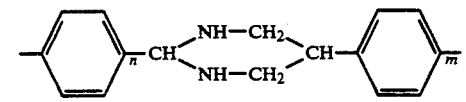

in which the aromatic rings in these groups can be mono- to trisubstituted by methyl, fluorine or chlorine or can be hydrogenated to the cycloalkane, $Y^1$ and $Y^2$, independently of one another, represent $-(-CH_2-)_q-$, $-(-Si(CH_3)_2-O-)_q-$, $-(-CH=CH-)_q-$ or $-(-C\equiv C-)_q-$, it being possible for the hydrogen atoms in these groups to be substituted in part or completely by methyl, fluorine or chlorine, $Z^1$, $Z^2$, $Z^3$ and $Z^4$, independently of one another, represent a single bond, $-O-$, $-S-$, $-CO-$, $-SO-$, $-SO_2-$, $-CO-O-$, $-O-CO-$, $=N-CO$, $-CO-N=$, $-NH-$ or $-N(C_1-C_4\text{-alkyl})-$, ion represents a cation, or an anion or a group which can be ionised to the cation or the anion, m represents 0 or 1, preferably 1, n represents integral values from 0 to 7, o represents integral values from 1 to 3, p represents the value 1 or 2 and q represents integral values from 1 to 20.

2. The layer element of claim 1, in which the modified support is selected from the group comprising the metal surfaces covered with a single layer of thiol, in which the thiol carries a further ionic or ionisable functional group, the supports treated with a silane and containing silicon, in which the silane carries an ionic or ionisable functional group, and the polymers carrying ionic or ionisable functional groups on the surface as a result of polymer-analogous reaction.

3. The layer element of claim 1, wherein X represents one of the groups

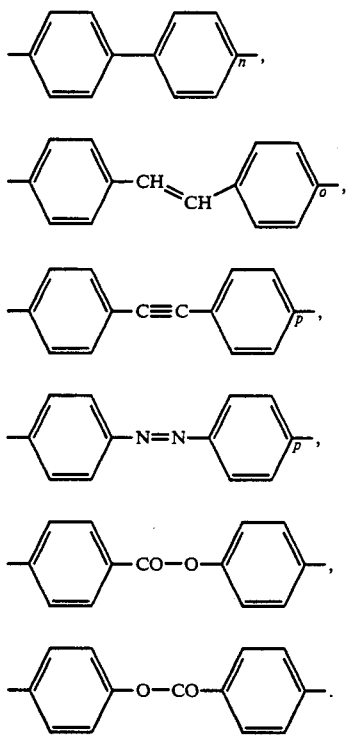

4. A process for the preparation of a layer element applied to a support, comprising:

(a) modifying a support having a flat surface so that the support carries ions or ionizable compounds of the same charge over the entire surface area of the support; and (b) applying one or more layers made of organic materials, the organic materials in each layer having ions of the same charge, the organic materials being applied from a solution of said organic materials to the modified support, the organic material for the first layer having ions of the opposite charge relative to the charge of the ions of the modified support and, in the case of further layers, each further layer containing ions of opposite charge relative to the charge of the ions in the previous layer, the organic material being either a monomeric substance having two ionic or ionizable functional groups of the same charge or polymers having a multiplicity of ionic or ionizable functional groups of the same charge (polyelectrolytes).

5. The process according to claim 4, wherein the solution or organic materials is a solution of the organic materials in water or in a mixture of water and a water-miscible, nonionic organic solvent.

6. The process according to claim 4, in which the two functional groups in the monomeric substances or the multiplicity of the functional groups in the polymers are in each case identical.

7. The process according to claim 4, in which the monomeric substance is one of the formula $$\text{ion}-Z^1-(-Y^1-Z^2-)_m-X-Z^3-Y^2-Z^4-\text{ion} \qquad (I)$$

in which

X represents

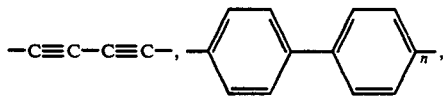

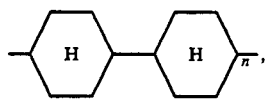

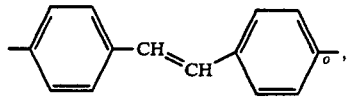

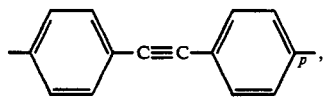

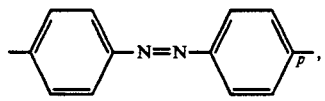

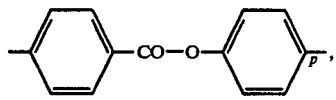

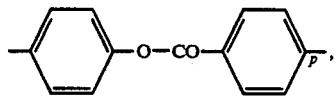

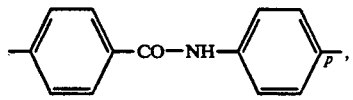

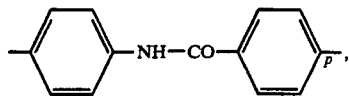

-continued

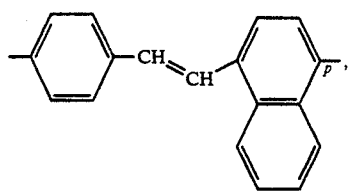

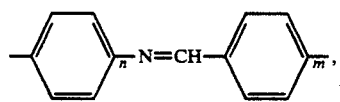

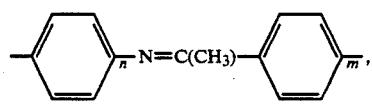

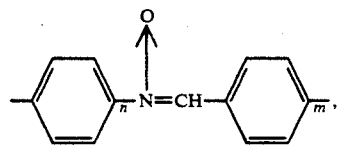

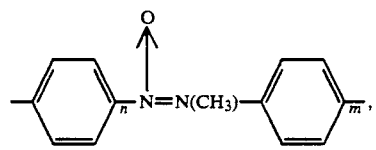

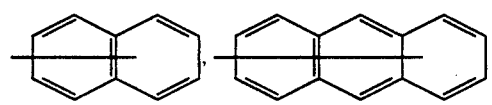

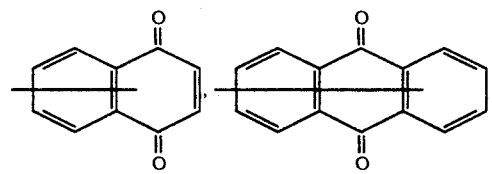

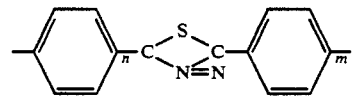

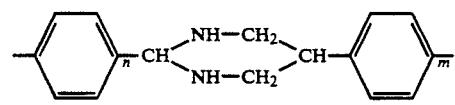

in which the aromatic rings in these groups can be mono- to trisubstituted by methyl, fluorine or chlorine or can be hydrogenated to the cycloalkane, $Y^1$ and $Y^2$, independently of one another, represent $-(-CH_2-)_q-$, $-(-Si(CH_3)_2-O-)_q-$, $-(-CH=CH-)_q-$ or $-(-C\equiv C-)_q-$, it being possible for the hydrogen atoms in these groups to be substituted in part or completely by methyl, fluorine or chlorine, $Z^1$, $Z^2$, $Z^3$ and $Z^4$, independently of one another, represent a single bond, $-O-$, $-S-$, $-CO-$, $-SO-$, $-SO_2-$, $-CO-O-$, $-O-CO-$, $=N-CO$, $-CO-N=$, $-NH-$ or $-N(C_1-C_4\text{-alkyl})-$, ion represents a cation, or an anion or a group which can be ionised to the cation or the anion, m represents 0 or 1, preferably 1, n represents integral values from 0 to 7, o represents integral values from 1 to 3, p represents the value 1 or 2 and q represents integral values from 1 to 20.

8. The process according to claim 7, wherein X represents one of the groups

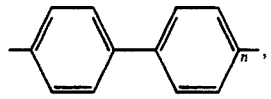

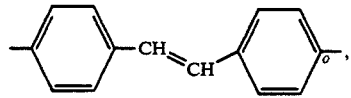

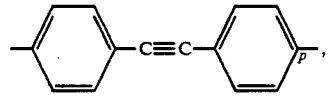

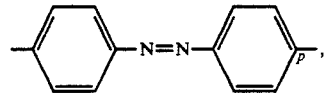

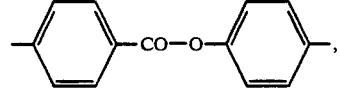

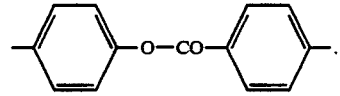

* * * * *

UNITED STATES PATENT AND TRADEMARK OFFICE
CERTIFICATE OF CORRECTION

PATENT NO. : 5,208,111

DATED : May 4, 1993

INVENTOR(S) : Decher, et al.

It is certified that error appears in the above-identified patent and that said Letters Patent is hereby corrected as shown below:

Col. 25, line 48    After formula insert -- or --

Signed and Sealed this

Sixth Day of September, 1994

Attest:

BRUCE LEHMAN

*Attesting Officer*    *Commissioner of Patents and Trademarks*